United States Patent
Jenny et al.

(10) Patent No.: US 7,316,747 B2
(45) Date of Patent: Jan. 8, 2008

(54) SEEDED SINGLE CRYSTAL SILICON CARBIDE GROWTH AND RESULTING CRYSTALS

(75) Inventors: Jason Ronald Jenny, Raleigh, NC (US); David Phillip Malta, Raleigh, NC (US); Hudson McDonald Hobgood, Pittsboro, NC (US); Stephan Georg Mueller, Durham, NC (US); Mark Brady, Carrboro, NC (US); Robert Tyler Leonard, Raleigh, NC (US); Adrian Powell, Apex, NC (US); Valeri F. Tsvetkov, Durham, NC (US); George J. Fechko, Jr., Apex, NC (US); Calvin H. Carter, Jr., Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/248,579

(22) Filed: Oct. 12, 2005

(65) Prior Publication Data

US 2006/0213430 A1   Sep. 28, 2006

Related U.S. Application Data

(63) Continuation-in-part of application No. 10/876,963, filed on Jun. 25, 2004, which is a continuation-in-part of application No. 10/064,232, filed on Jun. 24, 2002, now Pat. No. 6,814,801.

(51) Int. Cl.
 *C30B 25/12* (2006.01)
(52) U.S. Cl. .................. 117/86; 117/2; 117/3; 117/951
(58) Field of Classification Search .................... 117/2, 117/3, 86, 951
See application file for complete search history.

(56) References Cited

U.S. PATENT DOCUMENTS 4,866,005 A   9/1989   Davis et al.

(Continued)

FOREIGN PATENT DOCUMENTS

EP   1 160 361 A   12/2001

(Continued)

OTHER PUBLICATIONS

Kuhr et al.; "Hexagonal Voids and the Formation of Micropipes During SIC Sublimation Growth," J. Appl.Phys., vol. 89, No. 8, 2001, pp. 4625-4630.

(Continued)

*Primary Examiner*—Felisa Hiteshew
(74) *Attorney, Agent, or Firm*—Summa, Allan & Additon, P.A.

(57) ABSTRACT

A method is disclosed for producing a high quality bulk single crystal of silicon carbide in a seeded growth system and in the absence of a solid silicon carbide source, by reducing the separation between a silicon carbide seed crystal and a seed holder until the conductive heat transfer between the seed crystal and the seed holder dominates the radiative heat transfer between the seed crystal and the seed holder over substantially the entire seed crystal surface that is adjacent the seed holder.

68 Claims, 4 Drawing Sheets

U.S. PATENT DOCUMENTS

| | | |
|---|---|---|
| 5,119,540 A | 6/1992 | Kong et al. |
| 5,151,384 A | 9/1992 | Williams |
| RE34,861 E | 2/1995 | Davis et al. |
| 5,611,955 A | 3/1997 | Barrett et al. |
| 5,679,153 A | 10/1997 | Dmitriev et al. |
| 5,709,745 A | 1/1998 | Larkin et al. |
| 5,718,760 A | 2/1998 | Carter et al. |
| 6,201,342 B1 | 3/2001 | Hobart et al. |
| 6,218,680 B1 | 4/2001 | Carter, Jr. et al. |
| 6,396,080 B2 | 5/2002 | Carter, Jr. et al. |
| 6,403,982 B2 | 6/2002 | Carter, Jr. et al. |
| 6,507,046 B2 | 1/2003 | Mueller |
| 6,639,247 B2 | 10/2003 | Carter, Jr. et al. |
| 6,814,801 B2 | 11/2004 | Jenny et al. |
| 2002/0189536 A1 | 12/2002 | Otsuki et al. |
| 2003/0233975 A1 | 12/2003 | Jenny et al. |
| 2004/0201024 A1 | 10/2004 | Tsvetkov et al. |
| 2004/0206298 A1 | 10/2004 | Jenny et al. |
| 2005/0022724 A1 | 2/2005 | Malta et al. |
| 2005/0022727 A1 | 2/2005 | Fechko, Jr. et al. |

FOREIGN PATENT DOCUMENTS

| | | |
|---|---|---|
| JP | 2002060297 | 2/2002 |
| JP | 2002308699 | 10/2002 |
| JP | 2003002794 | 1/2003 |

OTHER PUBLICATIONS

Powell; "Growth of Low Micropipe Density SiC Wafere" Materials Science Forum, vol. 336-340, 2000, pp. 437-440.

Mueller; "Status of SIC Bulk Growth from an Industrial Point of View", Journal of Crystal Growth, vol. 211, No. 1, 2000, pp. 325-332.

Ivanov et al.; "Nitrogen Doping Concentration as determined by Photoluminescence in 4H- and 6H-SIC", Journal of Applied Physics, vol. 80, No. 6, 1996, pp. 3504-3508.

Dmitriev et al.; "Large Area Silicon Carbide Devices Fabricated on SIC Wafers with Reduced Micropipe Density", Materials Science and Engineering, vol. 861-62, 1999, pp. 446-449.

Sanchez et al.; "Formation of Thermal Decomposition Cavities in Physical Vapor Transport of Silicon Carbide", vol. 29, No. 3, 2000, pp. 347-352.

Rabeck et al.; "Thermodynamic Considerations of the Role of Hydrogen in Sublimation Growth", Journal of the Electrochemical Society, vol. 144, 1997, pp. 1024-1027.

Lilov et al.; "Studies of Growth Processes in Silicon Carbide Epitaxial Layers from the Vapour Phase", Journal of Crystal Growth, vol. 32, 1976, pp. 170-176.

Bakin et al.; "State of the Art in Defect Control of Bulk SiC", 1998 High Temperature Electronic Materials, Devices and Sensors Conference, 1998.

Muller et al., "Progress in the Industrial Production of SiC Substrates for Semiconductor Devices", Materials Science and Engineering; Mar. 22, 2001; pp. 327-331.

Search Report for ROC (Taiwan) Patent Application No. 094121084; Search Completion Date Apr. 14, 2007, 1 page.

(a)

(b)

SEEDED SINGLE CRYSTAL SILICON CARBIDE GROWTH AND RESULTING CRYSTALS

This application is a CIP of Ser. No. 10/876,963 Jun. 25, 2004 which is a CIP of Ser. No. 10/064,232 Jun. 24, 2002 U.S. Pat. No. 6,814,801.

CROSS REFERENCE TO RELATED APPLICATIONS

This is a continuation-in-part of Ser. No. 10/876,963 filed Jun. 25, 2004 for One Hundred Millimeter High Purity Semi-Insulating Single Crystal Silicon Carbide Wafer (now published as No. 20050126471). Ser. No. 10/876,963 is a continuation in part of copending and commonly assigned application Ser. No. 10/064,232 filed Jun. 24, 2002 for "Method for Producing Semi-Insulating Resistivity in High Purity Silicon Carbide Crystals" (now published as U.S. Pat. No. 6,814,801). Ser. No. 10/876,963 also claims priority from copending application Ser. No. 10/628,188 filed Jul. 28, 2003 for "Reducing Nitrogen Content in Silicon Carbide Crystals by Sublimation Growth in a Hydrogen-Containing Ambient" (now Published as No. 20050022727); Ser. No. 10/628,189 filed Jul. 28, 2003 for "Growth of Ultra-High Purity Silicon Carbide Crystals in an Ambient Containing Hydrogen" (now published as No. 20050145164); and Ser. No. 10/814,075, filed Mar. 31, 2004 for "Process for Producing High Quality Large Size Silicon Carbide Crystals" (now abandoned).

STATEMENT OF GOVERNMENT INTEREST

The U.S. Government has a paid-up license in this invention and the right in limited circumstances to require the patent owner to license others on reasonable terms as provided for by the terms of Contract No. N00014-02-C-0306 awarded by Defense Advanced Research Projects Agency (DARPA).

BACKGROUND

The present invention relates to silicon carbide single crystals, and in particular, relates to methods of forming high purity silicon carbide single crystal wafers that are at least 100 millimeters (mm) in diameter. Because of the relationship between English and Metric units (e.g., 25.4 mm=1 inch), such wafers are also referred to as "four inch" wafers.

The production of integrated circuits for many applications, such as RF devices, requires a substrate on which electronic devices can be built and connected to one another. Historically, sapphire was used as substrate material for microwave devices because of its high resistance to current flow. Sapphire has the disadvantage, however, of limiting the types of semiconductor layers that may be fabricated on the substrate with appropriate crystal lattice matching for proper device operation.

Silicon carbide (SiC) has a combination of electrical and physical properties that make it an attractive semiconductor material for high temperature, high voltage, high frequency and high power electronic devices. These properties include a 3.0 electron-volt (eV) bandgap (6H), a 4 Megavolt per centimeter (MV/cm) electric field breakdown, a 4.9 W/cmK thermal conductivity, and a $2 \times 10^7$ centimeter per second (cm/s) electron drift velocity. Silicon carbide is also particularly useful in its ability to be made conductive by doping or semi-insulating by various processing techniques. These qualities make silicon carbide a material of choice for a vast array of electronic applications.

Silicon carbide is, however, a difficult material to work with because it can crystallize in over 150 polytypes, some of which are separated from one another by very small thermodynamic differences. Furthermore, because of silicon carbide's high melting point (over 2700° C. under high pressure), many processes for working silicon carbide, including epitaxial film deposition, often need to be carried out at much higher temperature than analogous reactions in other semiconductor materials.

In one sense the commercial or manufactured synthesis of silicon carbide—typically for use as an abrasive—has been carried out for well over a century, with growth of polycrystalline silicon carbide being recognized by Acheson in 1885. The genesis of growth for electronic purposes, however, was initiated much later, being generally attributed to the development of the "Lely" method (named after its inventor) in 1955. In 1978, the first seeded sublimation techniques, which are also referred to as modified Lely techniques, were carried out, and by the late 1980s, silicon carbide technology was being rapidly commercialized, primarily by the assignee of the present invention.

In a seeded sublimation technique, a seed crystal and a source powder are both placed in a reaction crucible which is heated to the sublimation temperature of the source and in a manner that produces a thermal gradient between the source and the marginally cooler seed crystal. The thermal gradient encourages vapor phase movement of materials from the source to the seed followed by condensation upon the seed and the resulting bulk crystal growth. The method is also referred to as physical vapor transport (PVT).

In a typical silicon carbide growth technique, the crucible is made of carbon and is heated by induction or resistance, with the relevant coils and insulation being placed to establish and control the desired thermal gradients. The source powder is silicon carbide, as is the seed. The crucible is oriented vertically, with the source powder in the lower portions and the seed positioned at the top, typically on a seed holder; see U.S. Pat. No. 4,866,005 (reissued as No. RE34,861). These sources are exemplary, rather than limiting, descriptions of modern seeded sublimation growth techniques.

Other techniques incorporate the silicon carbide seed, but use gases rather than SiC solids, as the source materials. Examples include commonly assigned U.S. Pat. No. 6,824,611 and U.S. Published Application No. 20050120943, the contents of each of which are incorporated entirely herein by reference.

From a practical standpoint, increasing the rate at which large single crystals of silicon carbide can be grown, increasing the diameter to which they can be grown, and reducing the defect density in the large crystals remain necessary and desired goals.

Although the density of structural defects in silicon carbide bulk crystals has been continually reduced in recent years, relatively high defect concentrations still appear and have been found to be difficult to eliminate. These can cause significant problems in limiting the performance characteristics of devices made on the substrates, or in some cases can preclude useful devices altogether. For example, a typical defect density in some commercially available silicon carbide wafers can be on the order of 100 per square centimeter ($cm^{-2}$). A megawatt device formed in silicon carbide, however, will require a defect-free area on the order of 0.4 $cm^{-2}$. Thus, obtaining large single crystals that can be used to fabricate large surface area devices for high-voltage, high current applications remains difficult.

Although occasionally named differently, the most common defects in silicon carbide bulk crystals are generally referred to as micropipes and hexagonal voids. A micropipe is a hollow core super-screw dislocation with its Burgers vector lying along the c-axis. A number of causes have been proposed or identified for the generation of micropipes. These include excess materials such as silicon or carbon inclusions, extrinsic impurities such as metal deposits, boundary defects, and the movement or slippage of partial dislocations. See e.g., Powell et al., Growth of Low Micropipe Density SiC Wafers, Materials Science Forum, Vols. 338-340, pp 437-440 (2000).

Hexagonal voids are flat, hexagonal platelet-shaped cavities in the crystal that often have hollow tubes trailing beneath them. Some evidence shows that micropipes are associated with hexagonal voids. A relatively recent discussion of such defects (exemplary and not limiting) is set forth in Kuhr et al., Hexagonal Voids and the Formation of Micropipes During SiC Sublimation Growth, Journal of Applied Physics, Volume 89, No. 8, page 4625 (April 2001).

Recent research indicates that problems in the bulk crystals produced in a seeded sublimation technique can originate with the seed itself and the manner in which it is physically handled; e.g., Sanchez et al., Formation of Thermal Decomposition Cavities in Physical Vapor Transport of Silicon Carbide, Journal of Electronic Materials, Volume 29, No. 3, page 347 (2000). Sanchez uses the term "micropipe" to describe, "approximately cylindrical voids with diameters in the range of 0.1 µm to 5 µm that form at the core of superscrew dislocations aligned parallel or nearly parallel to the [0001] axis" Id. at 347. Sanchez refers to larger voids ("diameters from 5 µm to 100 µm") as, "thermal decomposition cavities," and opines that micropipes and thermal decomposition cavities arise from different causes. Id.

Based on this hypothesis and his experimental work, Sanchez suggests that migration of "silicon rich vapor" from the back (opposite to growth) surface of a seed crystal into the growth system, causes thermal decomposition cavities that generate micropipes in the seed and then in the growing crystal. Sanchez suggests, "a continuous diffusion barrier for silicon bearing species," will reduce or eliminate such cavities. Sanchez describes a carbonized sucrose barrier for this purpose, but admits that the technique is, "not entirely reproducible." Id. at 352.

Although sublimation growth from silicon carbide powder has remained a technique of choice as the commercial demand for silicon carbide has expanded, similar techniques that incorporate seeds, but not necessarily sublimation, have also come into favor. As well-understood by those of ordinary skill in this art, seeded growth techniques can offer advantages in initiating and maintaining polytype control in silicon carbide growth.

Several reasons, some intrinsic, some theoretical, and some practical, have encouraged seeded growth techniques other than conventional sublimation.

As one reason, sublimation growth requires a silicon carbide source powder. As a consequence, growth of larger crystals can require either a large initial charge of the silicon carbide source powder, or a replenishment system for the silicon carbide powder.

As another factor, much commercially available silicon carbide powder feedstock, although generally high-quality, still may contain some contaminants that preclude it from satisfactory incorporation where ultra high purity growth is desired or necessary.

As another factor, as silicon carbide source powder sublimes, the composition (concentration) of the initial source powder will tend to change. For example, because the amount of silicon species in sublimation vapor is at least the same as or greater than the amount of carbon species, the composition of the source powder gradually changes, with the amount of carbon increasing. This tends to change the partial pressure of the species in the vapor over time. This in turn can make polytype control more difficult.

As another factor, if the powder source needs to be replenished, on-going sublimation growth must be stopped and the necessary apparatus disassembled and reassembled following addition of new source material. This tends to reduce the practical rate at which large crystals can be grown.

Accordingly, alternatives to sublimation growth that nevertheless incorporate the advantages of seed crystals continue to be developed.

Because growth on a seed from vapor phase source materials requires carbon-containing vapors and silicon-containing vapors, most of these non-sublimation techniques (i.e. those that do not initiate with silicon carbide as a source powder) either supply or generate the species from sources other than silicon carbide powder.

Nevertheless, when such techniques incorporate a seed, the relationships between and among the seed, the seed holder, and the remainder of the system continue to have all of the thermodynamic factors that can cause problems—or if addressed properly can solve problems—in seeded sublimation growth. Stated differently, the thermodynamic factors surrounding the seed and the seed holder are essentially the same regardless of the source (silicon carbide powder or otherwise) of the vaporized silicon-containing and carbon-containing species.

Therefore, improvements in the seed crystal, in the seed holder, and in the relationship between the seed and the seed holder offer advantages in substantially all types of seeded growth, and in order to continue to provide improvements in the quality of single crystal silicon carbide bulk crystals, and to reduce the defect density, the source of defects at the seed must be identified and successfully addressed.

SUMMARY

In one aspect the invention is a method of producing a high quality bulk single crystal of silicon carbide in a seeded growth system, and in the absence of a solid silicon carbide source. In this aspect the invention comprises reducing the separation between a silicon carbide seed crystal and a seed holder until the conductive heat transfer between the seed crystal and the seed holder dominates the radiative heat transfer between the seed crystal and the seed holder over substantially the entire seed crystal surface that is adjacent the seed holder.

In another aspect the invention is a method of producing a high quality bulk single crystal of silicon carbide in a seeded growth system, and in the absence of a solid silicon carbide source comprising positioning the seed crystal in a crucible while exerting minimal torsional forces on the seed crystal to thereby prevent torsional forces from warping or bowing the seed crystal in a manner that that would otherwise encourage sublimation from the rear of the seed crystal or undesired thermal differences across the seed crystal.

In another aspect the invention is a method of producing a high quality bulk single crystal of silicon carbide in a seeded growth system, and in the absence of a solid silicon carbide source, comprising positioning a seed crystal on the seed holder with a low porosity backing material that provides a vapor barrier to silicon carbide sublimation from the seed and that minimizes the difference in thermal conductivity between the seed and the backing material to minimize or eliminate temperature differences across the seed and likewise minimize or eliminate vapor transport from the rear of the seed that would otherwise initiate and propagate defects in the growing crystal.

The foregoing and other objects and advantages of the invention and the manner in which the same are accomplished will become clearer based on the followed detailed description taken in conjunction with the accompanying drawings.

DETAILED DESCRIPTION

Figure 1:
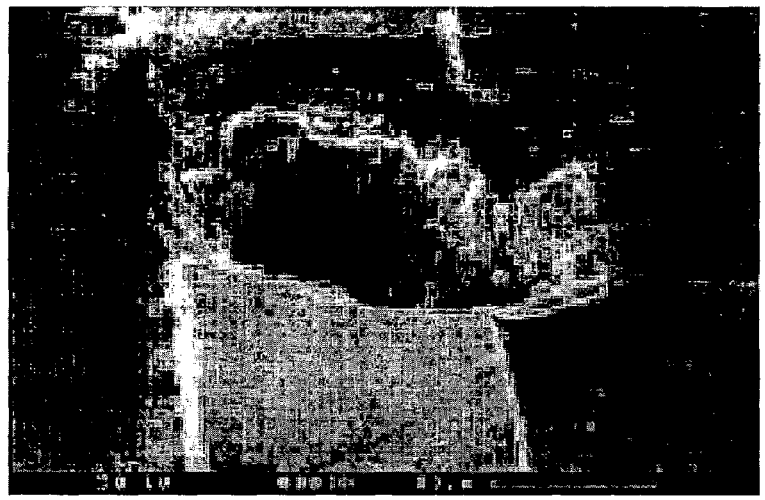
FIGS. 1 and 2 are micrographs reproduced from scientific papers in this field, both of which illustrate micropipes in silicon carbide.

The invention relates to seeded growth of silicon carbide using sources other than solid silicon carbide. As used herein, the term, "solid silicon carbide source," refers to the primary starting material for the particular growth system and will be understood in context. Thus, silicon carbide powder (including powders of various particles sizes) is a, "solid silicon carbide source."

In turn, sources other than, "solid silicon carbide," include gases that react to form solid SiC precursors such as gas source species that react in the growth system to form small particles of silicon, carbon, or silicon-carbon species in a suspended or colloidal state (i.e., finely divided dispersions of liquid or solid material in a continuous gas phase).

Similarly, sources other than "solid silicon carbide" include the use of separate solid silicon and solid carbon sources (either or both) to generate gaseous species that eventually react to form silicon carbide on a silicon carbide seed crystal.

Other seeded techniques start with one gas source and one solid source; e.g. silicon-containing gases reacting with solid carbon or vice versa. These sources are likewise other than solid silicon carbide.

As well-understood by those of ordinary skill in this art, the term "single crystal" (or its equivalent, "monocrystalline"), particularly for crystals of the size described and claimed herein, is properly applied to such large crystals even when they contain small areas, regions or amounts of other polytypes of silicon carbide. Thus, large high-quality crystal wafers, in which a single polytype overwhelmingly predominates, are properly referred to herein as "single crystals."

The term "wafer" is used herein in its normal sense to describe primarily circular slices of high quality semiconductor material, in particular silicon carbide, that are cut from larger bulk single crystals and then typically polished and otherwise finished for further use. Those of ordinary skill in this art will recognize the appropriate use of terms such as, "wafer," "seed," and "crystal" in context.

In preferred embodiments, the techniques described herein can be used to produce wafers with diameters of about 100 mm or 4 inches. As noted elsewhere herein, the relationship between metric units and English units is such that a 4 in. wafer will be 101.6 mm in diameter. Those of ordinary skill in this art recognize these factors, and will understand that the invention covers wafers that are exactly 100 mm in diameter, as well as those exactly 4 in. in diameter.

The wafers according to the present invention are suitable for high frequency power devices, high power devices, high temperature devices, optoelectronic devices, and Group III nitride deposition.

The wafers can be selected from the 3C, 4H, 6H and 15R polytypes of silicon carbide with the 4H polytype being presently most preferred. The wafers are available in an on-axis orientation or various off-axis orientations such as (but not limited to) 3.5°, 4°, and 8°. As one example, off-axis or off-orientation wafers can (but do not necessarily) refer to the angle between the projection of the normal vector to the surface onto a {0001} plane in the projection on that plane of the nearest <11-20> direction.

Wafers according to the invention have less than 200 micropipes per square centimeter ($cm^{-2}$), more preferably less than 100 micropipes per square centimeter, in more preferred embodiments less than 30 micropipes per square centimeter, and in low and ultra-low density, less than 15 and less than five micropipes per square centimeter respectively.

The wafers can include a single side polish with either the silicon or the carbon face ready for epitaxial growth or can be double side polished with either the silicon or the carbon face ready for the epitaxial growth. The wafers can be finished with a chemical mechanical polish with the silicon face or the carbon face epitaxial ready, or with a double side chemical mechanical polish with either face epitaxial ready.

As used herein, the wafer's diameter refers to the linear dimension across the surface of the wafer with measurement performed manually with ANSI certified digital calipers on each individual wafer.

The thickness is measured at the center point with ANSI certified non-contact tools. The flatness is similarly measured with certified digital calipers on a sample of one wafer per ingot. For 100 mm wafers, the tolerance is within 0.015 in. (0.38 mm). Wafers according to the present invention have standard thicknesses of between about 350 and 700 microns (μm) depending on intended end use.

The off-axis surface orientation refers to the orientation of the surface of the wafer with respect to a crystallographic plane within the lattice structure. Surface orientation is measured with an x-ray goniometer on a sample of one wafer per ingot in the center of the wafer.

For commercial purposes, the wafers are available with both primary and secondary flats. As is conventional in semiconductor terminology, the primary flat represents the flat of the longest length on the wafer, oriented such that the flat is parallel with a specified low index crystal plane. The primary flat is measured on one wafer per ingot using reflection techniques with manual angle measurements.

The secondary flat is the flat of shorter length than the primary flat and the position of the secondary flat with respect to the primary flat identifies the face of the wafer. In preferred embodiments, the carbon face of each individual wafer is laser marked with optical character recognition compatible fonts consistent with definitions and characteristics in the semiconductor industry.

Wafers according to the present invention can also comprise one, several, or multiple epitaxial layers on the surface and these layers are typically and preferably selected from the group consisting of silicon carbide and the Group III nitrides. The electronic properties and advantages of each of these types of materials are well recognized and well understood in this art, and thus will not be discussed further in detail herein.

The invention can accordingly include a device that incorporates the wafer and epitaxial layer as just described, and in most circumstances, a relatively large plurality of such devices will be formed on a wafer and potentially tested on the wafer before being separated into individual devices for end use.

As set forth in the Background, the present invention provides advantages in seeded bulk growth of large single crystals of silicon carbide, other than sublimation growth. Although seeded growth of this type is analogous in some aspects to sublimation growth, it refrains from using a solid silicon carbide source at least in the conventional sense. Thus, the invention described herein relates primarily to the nature of the seed, the nature of the seed holder, and the relationship between the seed holder and the seed. These improvements are advantageous with respect to any type of seeded growth. Examples of seeded growth other than conventional sublimation growth include, but are not limited to, U.S. Patents and publications Nos. U.S. Pat. No. 6,824,611 (silane and carbon-containing source gases are heated to form silicon-carbon gas species that are encouraged to condense on a seed crystal); U.S. Pat. No. 6,056,820 (melted silicon feedstock is vaporized to react with high purity carbon to promote growth on the seed); U.S. Pat. No. 6,336,971 (silicon vapor evaporated from raw silicon passes through a heated carbon member to reach a seed crystal); U.S. Pat. No. 5,985,024 (silicon feedstock is melted and vaporized and then reacts with a high purity carbon-containing gas); U.S. Pat. No. 6,514,338 (silicon raw material reacts continuously with carbon raw material to generate gas which reaches the seed crystal); U.S. Pat. No. 6,821,340 (silicon source gases and carbon source gases are directed toward a seed under specific conditions of partial pressure in alternating time-based fashion); U.S. Pat. No. 6,830,618 (a gas mixture is introduced to a silicon carbide seed); 20040231583 (a gas mixture is introduced into a crucible with a thermal gradient to reach a silicon carbide seed) and 20040216661 (forming silicon particles from a silicon source, then forming silicon-carbon particles from the silicon particles, then encouraging sublimation type growth on a seed from the silicon-carbon particles).

These and other seeded growth processes typically require temperature control of different regions within the growth chamber, including control of the temperature of the seed crystal. In most cases, the temperature of the seed crystal is maintained at a temperature lower than the temperature of the source materials in order to encourage vapor phase materials to condense upon the seed crystal. The seed crystal thus provides the growth surface for fabricating a silicon carbide crystal with the desired dimensions.

Such temperature control is carried out using several techniques that are well understood by those of ordinary skill in this art. Typically they include controlling the position (geometry) at which the growth chamber or apparatus is heated, controlling the amount of energy applied to the heating source (typically inductive or radiative) at one or more positions, and designing and arranging insulation with respect to the growth apparatus in a manner that similarly controls temperature effects. Silicon carbide growth is typically carried out at temperatures of at least about 2000° C.

As noted in the Background, the general aspects of seeded growth of silicon carbide have been generally well established for a number of years. Furthermore, those familiar with the growth of crystals, particularly in difficult material systems such as silicon carbide, will recognize that the details of a given technique can and will vary, usually purposefully, depending upon the relevant circumstances. Accordingly, the descriptions given herein are most appropriately given in a general and schematic sense with the recognition that those persons of skill in this art will be able to carry out the improvements of the invention based on the disclosures herein without undue experimentation.

FIG. 1 is a micrograph of a micropipe-caused failure in a silicon carbide device (V. Dmitriev et al., Large Area Silicon Carbide Devices Fabricated on SiC Wafers with Reduced Micropipe Density, Materials Science and Engineering B61-62 (1999) 446-449).

Figure 2:

FIG. 2 is another micrograph of a micropipe as set forth by Bakin et al., State of the Art in Defect Control of Bulk SiC, Invited Talk at the 1998 High Temperature Electronic Materials, Devices and Sensors Conference (1998), San Diego, Calif., pp. 2-13. FIGS. 1 and 2 are included for illustration purposes and to provide context to the invention.

As noted in the Background, recent thinking hypothesizes that unintended sublimation from the rear (opposite to growth) face of the seed crystal initiates micropipe defects that propagate through the seed and thereafter into the growing crystal. From a functional standpoint, the goal is to maintain a proper growth shape throughout the entire growth cycle while minimizing or eliminating relevant defects such as micropipes.

Although such effects are addressed herein, the present invention also includes the recognition that other (or in some cases most) micropipe defects do not necessarily initiate in the seed, but rather in the growing crystal during the early stages of its growth. In turn, the invention incorporates the recognition that the physical relationship between and among the seed crystal and the seed holder similarly affects the degree to which defects form—or are prevented from forming—in the growing crystal.

In turn, the invention incorporates the recognition that inconsistent thermal circumstances at the interface of the seed crystal and the seed holder tend to generate changes in growth that can be, and often are, manifested as micropipes or other defects in the growing crystal. Accordingly, the invention provides various techniques for ensuring a consistent thermal relationship between the seed crystal and the seed holder.

Stated differently, if the temperature profile across the seed-seed holder interface is inconsistent, such thermal differences can conductively affect the growth interface between the seed and the growing crystal. The resulting thermal inconsistencies at the seed-growth interface have been found to encourage the initiation and propagation of micropipes or other defects in the growing bulk crystal.

In one aspect of the invention, providing the consistent thermal circumstances is achieved by minimizing the separation of the seed and the seed holder to ensure that conductive heat transfer exceeds, and preferably dominates, radiative heat transfer over substantially the entire area between the seed and the seed holder. In particular, it has been discovered according to the present invention that superior results are achieved when the seed crystal and seed holder are in macroscopic direct contact and that their respective contacting surfaces always conform to one another within 10 µm or less, more preferably 5 µm or less, and most preferably 2 µm or less, including less than 1 µm wherever possible.

In turn, such a relationship can be fostered by using a seed crystal that deviates from flat by no more than 10 µm, more preferably no more than 5 µm and most preferably less than 2 µm and potentially less than 1 µm.

Furthermore, using a seed holder that deviates from flat by no more than 10 µm is likewise preferable to obtain the desired relationship. As in the case of the seed, the deviation is preferably no more than 5 µm and most preferably less than 2 µm and potentially less than 1 µm. Additionally, the seed crystals should be internally homogeneous.

These tolerances are at least an order of magnitude more accurate than those generally recognized in the art as being necessary for such purposes. For example, a silicon wafer of three-inch (3") diameter is considered acceptable if it has a total thickness variation (TTV) of 25 µm, a maximum bow of 40 µm, and a maximum warp of 40 µm (e.g., SEMI M1.2-89, "Standard for 3 inch Polished Monocrystalline Silicon Wafers, SEMI 1978, 1999).

As used herein, the term "bow" refers to the bending of the wafer into a curve; i.e., the deviation of the center point from the average position of the surface. In slight contrast, the term "warp" refers to a twisting or turning of the wafer away from its desired flat shape; i.e., the largest "peak" to "valley" distance across the wafer.

Obtaining the desired conformity between the seed and the seed holder can be enhanced by a number of techniques. It will be understood that from a theoretical perspective, the seed and seed holder can be any respective shapes provided that they conform within the 10 µm tolerance. In most circumstances, however, the most straightforward method of obtaining the desired conformity is to make both items as flat as possible.

Thus, in one aspect the method comprises using a relatively thick seed crystal; i.e., on the order of about 1.4 mm rather than the more conventional 600-700 µm for a three-inch seed crystal. The thicker seed offers several advantages in the method of the invention. First, because increased thickness correspondingly increases the mass of the seed, the seed has a greater total heat capacity and can more efficiently moderate temperature differences that originate at the seed holder and present the growing seed with a lesser thermal inconsistency than exists at the seed-seed holder interface. The high thermal conductivity of silicon carbide also helps moderate temperature differences more quickly and evenly in larger (i.e., proportionally thicker) seeds than in thinner ones.

Second, a thicker seed can be polished more readily. Polishing the seed offers at least two advantages in the invention. First, it helps reach the flatness tolerances noted above. Second, polishing helps reduce or eliminate subsurface damage that may be present in the seed crystal. According to the invention, it has been discovered that if such subsurface damage remains in the seed, the high growth temperatures used for silicon carbide will tend to anneal (repair) such damage at high temperature. The annealed crystal then tends to experience mechanical relaxation in the absence of the mechanical stress caused by the subsurface damage at room temperature. In turn, the relaxed crystal tends to change shape, which in turn tends to produce the undesired and problematic thermal inconsistencies.

Stated differently, if the seed is flat at room temperature in the presence of the stress produced by any subsurface defects, annealing the seed will relax the stress and thus cause the wafer to deviate from flat.

As a third advantage, at any given diameter a thicker seed simply tends to bend less at any temperature, including growth temperatures, all other factors being equal.

In another aspect, the method can comprise double side lapping of the seed wafer to machine it to a flat shape exhibiting a deviation from flat of less than 10 µm, more preferably less than 5 µm and most preferably 2 µm or less. Alternatively, the wafer can be machined to a shape conforming to the shape of the seed holder for the same purpose. Other equivalent methods can also be incorporated such as grinding or polishing. As stated above, the goal is to produce a seed over which there is no more than 10 µm deviation from flat at any point.

Figure 3:
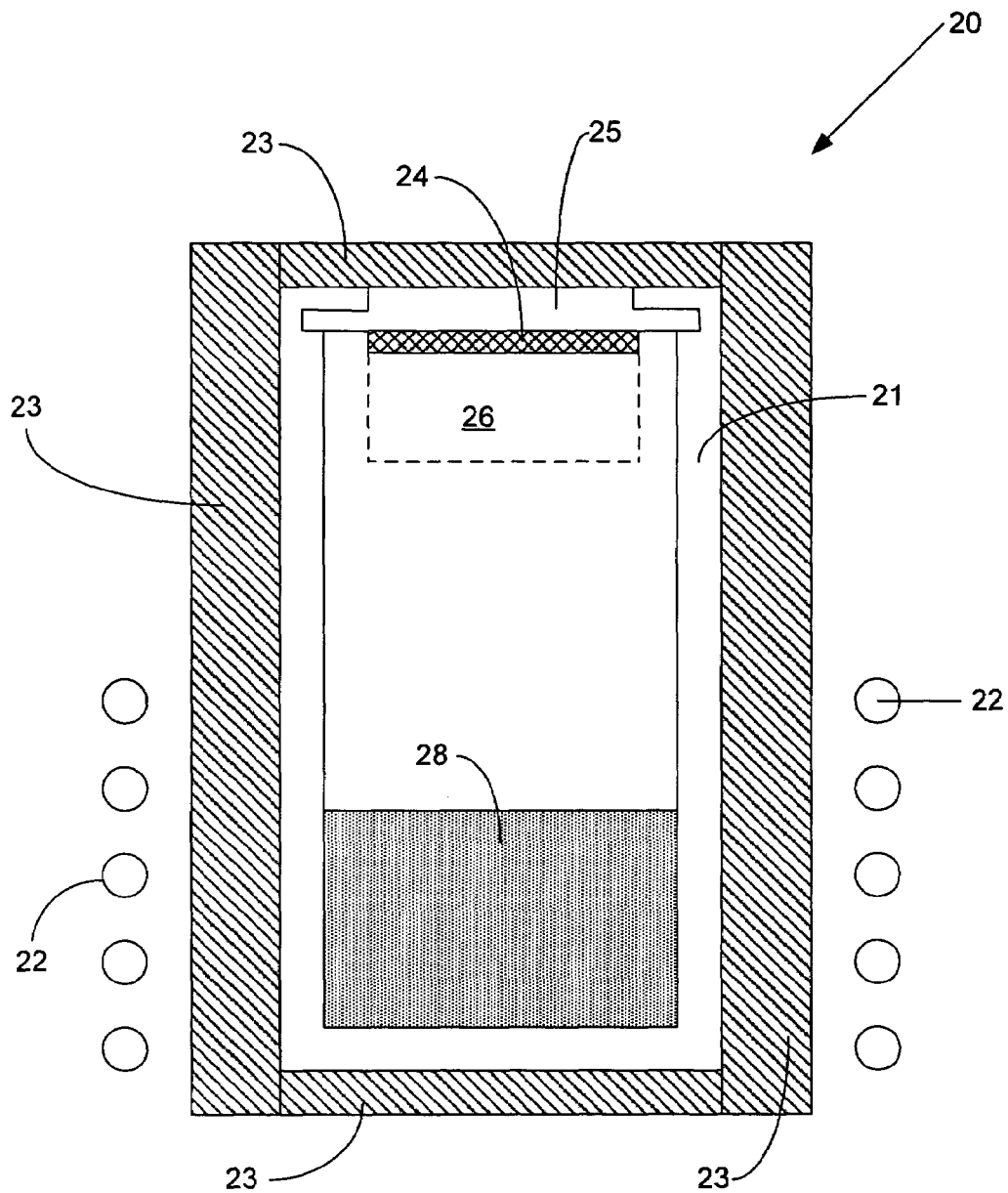
FIG. 3 is a cross-sectional schematic view of a conventional sublimation growth system for silicon carbide.

FIG. 3 is a cross sectional schematic diagram of a system for seeded growth of the type for which the invention provides several improvements. The system is broadly designated at 20. As in many systems, the system 20 includes a graphite susceptor 21 and a plurality of induction coils 22 that heat the susceptor 21 when current is applied through the coils 22. Alternatively, some systems incorporate resistance heating. It will be understood by those familiar with these crystal growth techniques that the system can be further enclosed in some circumstances, e.g., in a water-cooled quartz vessel. Such further enclosures are, however, less relevant to the invention and are omitted herein to help clarify the drawing and description. Additionally, those persons skilled in this art recognize that growth systems of the type described herein are available both commercially and as constructed in a custom fashion as may be necessary or appropriate. They accordingly can be selected or designed by those of ordinary skill in this art without undue experimentation.

The susceptor 21 is typically surrounded by insulation, several portions of which are illustrated at 23 in FIG. 3. Although FIG. 3 illustrates the insulation as being generally consistent in size and placement, it will be understood and is recognized by those of skill in the art that the placement and amount of the insulation 23 can be used to provide desired thermal gradients (both axially and radially) along the susceptor 21. Again, for purposes of simplification, these possible permutations are not illustrated herein.

The susceptor 21 includes one or more portions 28 for containing or receiving the relevant source materials. FIG. 3 illustrates the source materials as being located in a lower portion of the susceptor 21 and this is one typical arrangement. As another familiar variation, some systems introduce or distribute the source materials in a vertical, cylindrical arrangement in which the source surrounds a larger portion of the interior of the susceptor than does the arrangement illustrated in FIG. 3. The invention described herein can be appropriately used in both types of equipment.

The seed crystal of silicon carbide is designated at 24, and is typically placed in upper portions of the susceptor 21. A seed holder 25 is typically used to hold the seed 24 in place with the seed holder 25 being attached to the susceptor in an appropriate fashion. This can include various resting or threaded arrangements. In the orientation illustrated in FIG. 3, the upper portions of the seed holder 25 would typically include threads as would the uppermost portions of the graphite susceptor 21 so that the seed holder 25 could be threaded into the top of the susceptor 21 to hold the seed 24 in the desired position. The growing crystal is illustrated by the dotted rectangle designated 26.

The general scheme for seeded growth is set forth briefly in the Background portion of the specification as well as in a number of the references already referred to herein, and in other sources well-known to those of ordinary skill in this art. Typically, an electric current, having a frequency to which the susceptor 21 responds, is passed through the induction coils 22 to heat the graphite susceptor 21. The amount and placement of the insulation 23 are selected to create a thermal gradient between the source 28 and the growing crystal 26 when the susceptor 21 heats the source materials to growth temperatures. The thermal gradient is established to maintain the temperature of the seed 24 and thereafter the growing crystal 26 near, but below the sublimation temperature of silicon carbide to thereby thermodynamically encourage the vaporized source species to condense first upon the seed crystal and thereafter upon the growing crystal.

For purposes of clarity, the singular term, "thermal gradient," will be used herein, but it will be understood by those of skill in this art that several gradients can desirably co-exist in the susceptor 21 and can be subcategorized as axial and radial gradients, or as a plurality of isotherms.

If the temperature gradients and other conditions (pressure, carrier gases, etc.) are properly maintained, the overall thermodynamics will encourage the vaporized species to condense first on the seed crystal 24 and then on the growing crystal 26 in the same polytype as the seed crystal 24.

Figure 7:
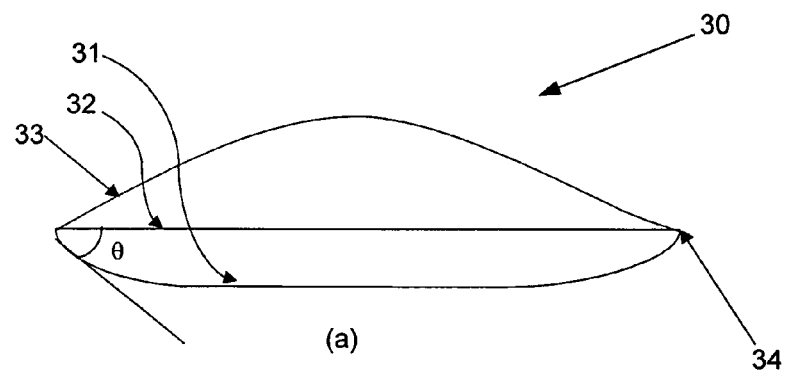
FIG. 7 is a schematic illustration of some of the factors related to the present invention.
Figure 7:
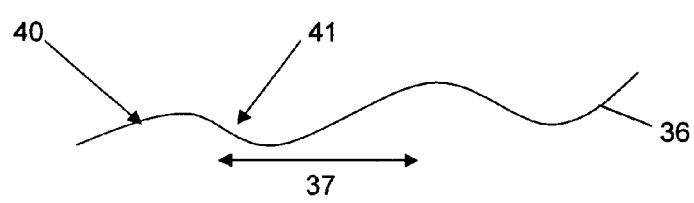

FIG. 7 is an exaggerated schematic illustration of some of the factors related to the present invention. It will be understood that FIG. 7 is entirely schematic and illustrative in nature and is not meant to represent, either in scale or in exact shape, any particular crystal.

FIG. 7a illustrates a crystal seed broadly illustrated at 30 with three different types of growth surfaces being respectively indicated at 31, 32 and 33. The growth surface indicated by the arrow 31 is concave and according to the invention will be considered to be excessively concave if the growth surface deviates from flat by more than 10 μm.

The surface illustrated by the arrow 33 is considered excessively convex, again because the deviation from a flat surface is more than 10 μm.

An appropriate flat surface is indicated by the arrow 32 and extends across the entire usable area of the crystal, the boundary of which is designated by the arrow 34.

FIG. 7b schematically illustrates problems that can arise in "local" areas of the crystal surface in which the growth surface is indicated at 36 and the dimensions of the local area (as defined herein) are indicated by the horizontal arrow 37. The arrows 40 and 41 indicate respective areas of high local curvature that can affect the growth in a disadvantageous manner in the same way as the overall undesirable growth shapes illustrated in FIG. 7a.

In considering the proportional dimensions of the diameter and thickness of the seed crystal, whether expressed as a percentage, a fraction, or a ratio, it will be understood that in the context of the improvements provided by the invention, these proportions have their inventive meaning in the context of the larger-diameter seed crystals that are described herein.

Accordingly, in certain embodiments the invention is described and claimed herein in the relevant embodiments in a manner that includes the absolute dimensions of the crystal, usually in terms of a diameter, of which 2 inch, 3 inch and 100 mm diameter single crystals are preferred.

The invention provides an improvement in the nature and handling of seed crystals in the growth environment in a manner that enables large crystals of desired diameters to be obtained.

In another sense, the nature of certain power devices is such that even in the semiconductor context, in which devices are typically physically much smaller than are equivalent conventional devices, some devices must still be relatively large and thus require large substrates and large defect-free single crystals. The invention provides its advantages in the context of the larger crystals that are required for such larger devices. Thus, previous single crystals, even those of high quality, that cannot match the absolute dimensions of the crystals described and claimed herein are not relevant to the evaluation of the invention.

Even in situations or devices that do not require larger substrates, the normal and relevant goals of increasing the usable amount of any given bulk single crystal still apply. Thus the invention offers its advantages in terms of such larger bulk crystals rather than in a mere conceptual context in which size has no performance or commercial value.

Although it may initially appear contradictory to refer to seed crystals having otherwise thin profiles as being "thick," it will be understood that the goal of the invention is to provide a seed crystal that is thin for overall efficiency purposes but thick enough for the physical and thermal purposes of the invention. Stated differently, if all other conditions were perfect or ideal, the amount of seed crystal required would be no more than the smallest that could still encourage single polytype growth upon its surface. From the opposite standpoint, if silicon carbide were an easy or inexpensive material to grow or produce, the thickness of the seed crystal would not matter for efficiency purposes. In the present invention, however, the goal is to maximize the use of each seed crystal, which encourages the use of thin seeds. Within the context of efficiently thin seeds, however, the ratios described herein can help solve certain growth problems.

Figure 4:
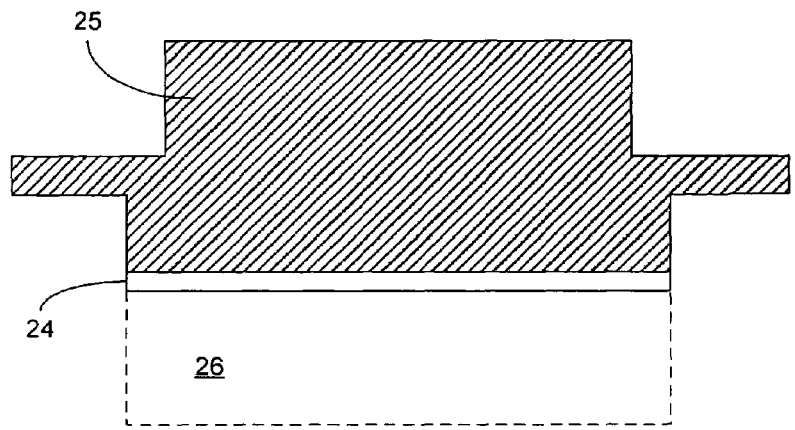
FIGS. 4 and 5 are respective cross-sectional schematic diagrams of seed holders, seed crystals, and growing crystals relating to the present invention.
Figure 5:
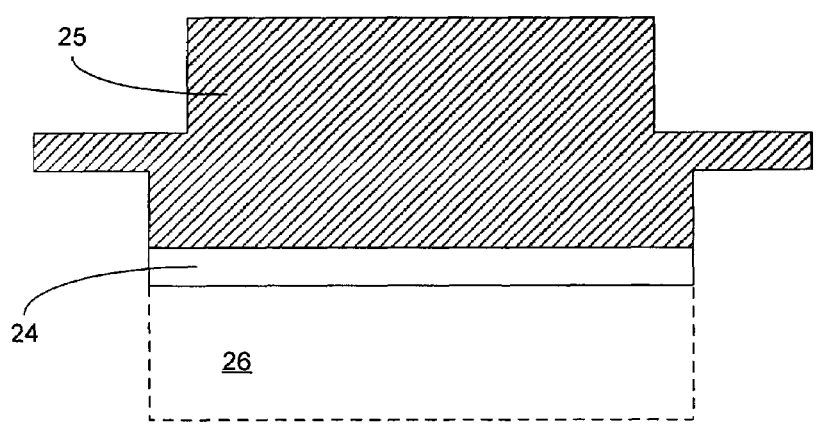

FIGS. 4 and 5 are schematic illustrations of the relative size differential in the seed crystals according to the present invention. In both figures the seed holder is illustrated at 25, the seed crystal at 24 and the growing seed at 26. Thus, FIG. 4 illustrates (in admittedly exaggerated fashion) a more conventional "thin" seed crystal, while FIG. 10 illustrates a proportionally thicker crystal according to the invention.

In another embodiment, the invention is the improvement in seeded growth of silicon carbide that comprises lapping both sides of a silicon carbide seed crystal to minimize or eliminate any warp or bow in the crystal that would otherwise encourage sublimation from the rear of the seed crystal or undesired thermal differences across the seed, thereafter initiating seeded growth using the lapped crystal, and thereafter growing the bulk single crystal at substantially the same diameter as the seed. In preferred embodiments, the seed is at least 2 inches in diameter and most preferably larger, including diameters of 3 inches and 100 mm.

In the first embodiment, the purpose of obtaining the proportionally thicker crystal is to prevent the high temperatures to which the crystal is typically exposed from causing the crystal to warp or bow under the thermal stresses generated by those high temperatures. In the next embodiment, the goal is similar; i.e., to prevent undesired crystal growth effects from taking place at the seed crystal, particularly at or from the rear of the seed crystal. In this embodiment, however, lapping and polishing the seed crystal provides an extremely smooth and level surface that helps discourage localized temperature or physical differences across the seed during growth and that also helps to minimize or eliminate the space or spaces that have been identified as being present between the seed crystal and the seed holder in some embodiments.

In a typical technique the crystal is lapped by using an abrasive slurry in conjunction with a hard surface to quickly remove a fairly large amount of material, and thereafter polished by using a similar slurry, but in a milder fashion and with a softer surface to produce a finished surface of semiconductor material. Such techniques are well known in the art and can be selected and used by those of ordinary skill without undue experimentation and thus will not be described in further detail herein.

In another embodiment, the invention is the improvement in seeded growth that comprises positioning the seed crystal in a crucible while minimizing or eliminating torsional forces on the seed crystal to thereby prevent the torsional forces from warping or bowing the crystal in a manner that would otherwise encourage sublimation from the rear of the seed crystal or undesired thermal differences across the seed.

Once again, the goal is to use the nature and positioning of the seed crystal in a manner that prevents undesired defect generation in the seed during growth to thereby prevent those defects from being propagated into the growing bulk crystal.

In this embodiment, the method preferably comprises positioning the seed crystal on a seed holder and placing the seed holder and the seed crystal in the crucible portion of the seeded growth system. Most preferably, this comprises mounting the seed crystal in an edge ring seed cap and positioning the edge ring seed cap in the seed holder to thereby minimize the mechanical forces applied to the seed crystal to in turn minimize or eliminate any distortion in the seed crystal resulting from its mounting on the seed holder.

Although the down-force applied to the ring has not been directly measured, by inference from other measurements and techniques, the force is estimated to be about one Newton and the dimensions of the ring are such as to apply this amount of force to the outer 1 mm of the seed wafer.

Figure 6:
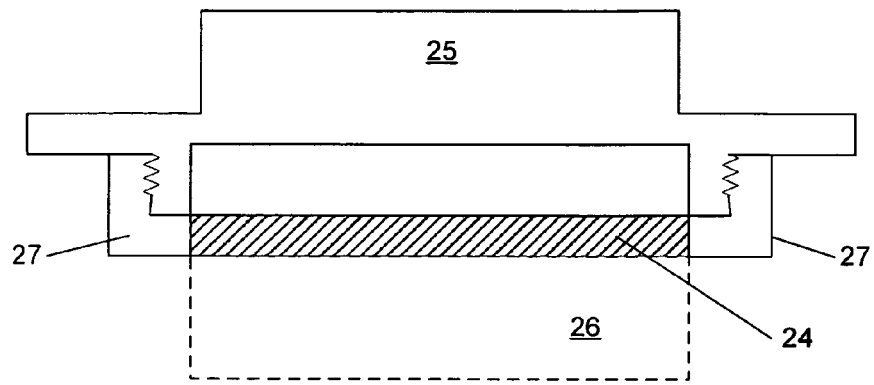
FIG. 6 is a cross-sectional schematic diagram of a seed holder and silicon carbide seed crystal according to the present invention.

FIG. 6 illustrates an edge ring seed cap of this type designated at 27, with the other common elements carrying the same reference numerals as in FIGS. 4 and 5. Thus, the edge ring seed cap 27 carries the seed crystal 24 and thereafter the growing crystal 26. In turn, the edge ring seed cap 27 is threaded to the seed holder 25, which is incorporated in the overall system as schematically illustrated in FIG. 3.

As noted above, this embodiment can also include the advantages of the previous to embodiments; i.e., the crystal can be "thick" enough for thermal purposes and can be double lapped to provide the desirably smooth surfaces.

In yet another embodiment, the improvement according to the invention comprises annealing the seed holder prior to seeded growth to prevent the seed holder from significant distortion during crystal growth at silicon carbide growth temperatures to thereby minimize or eliminate temperature differences across the seed that would otherwise tend to initiate and propagate defects into the growing bulk crystal. Thereafter, the method comprises initiating seeded growth with the seed crystal, and then growing the bulk single crystal at substantially the same diameter as the seed crystal.

The time and temperature profile for annealing the seed holder can be selected by those of ordinary skill in this art without undue experimentation based upon the relatively well understood characteristics and properties of materials such as graphite (carbon) which are typically used in most suitable susceptors and seed holders. In a particular embodiment using a carbon seed holder, however, the method comprises annealing the seed holder at a temperature of at least about 2500° C. for a period of at least about 30 minutes.

The relevant terms will be understood by those of ordinary skill in this art, but for purposes of confirmation, the term "uniform" refers to a consistent surface as observed by the eye or with a microscope. "Uniform" also refers to consistency for areas ranging in lateral dimensions from the wafer diameter down to areas as small as 10 µm. The term "flat" means that the crystal forms a basal facet in such a region. Flat also refers to a slope of less than one degree and the term "slightly convex" refers to a radius of curvature of less than 40 cm. Thus, the surface is "too convex" if its overall convexity exceeds the stated levels and the surface is "too concave" if the growth surface deviates from flat by more then the stated angle (i.e., preferably one degree).

Those familiar with the growth of silicon carbide crystals will also understand that this undesired curvature can occur in localized areas rather than over the entire seed, but with the same effects that should be avoided. Such localized regions are best understood as being areas that are small as 10 µm in diameter (or across their largest dimension if irregular) up to the full wafer diameter which is typically on the order of 2 in., 3 in., or 100 mm.

In this aspect, the method preferably comprises maintaining the flat to slightly convex growth surface during the first 500 µm to 10 mm of the crystal growth over the usable diameter of the crystal. As part of this aspect, it has been discovered that the shape of the growing crystal at the early stages of growth is more important than has been generally recognized to date. Conventionally, the growth is considered satisfactory if the overall resulting bulk crystal has a convex surface when growth is complete or otherwise large enough to observe. In contrast, the present invention includes the recognition that concave growth at early stages tends to generate micropipes that propagate throughout the crystal even if the end result is an appropriately convex-surface bulk crystal. As noted elsewhere herein, conventional thought believes that micropipes initiate at the rear (non-growth) surface of the seed crystal. In contrast, the invention recognizes that micropipes initiate at the front surface (the seed-growth interface) and their avoidance must be addressed at that location as well as elsewhere.

The term "usable area" is likewise understood by those of ordinary skill in this art and represents the area of the crystal that will be selected and used to fabricate substrates. As an example, the crystal could be grown with a diameter of 150 mm for the purpose of cutting a 75 mm diameter portion and making wafers from this smaller portion. In such a case, the usable area would be represented by the selected 75 mm portion. As another example, a 150 mm crystal could be directly cut into 150 mm wafers of which only the center 75 mm diameter portion is high quality material with the outer portion being lower-quality material. In this case, the usable area would refer to the high quality (low defect level) region.

The preferred control over the early growth thicknesses of between 500 µm and 10 mm defines the invention in contrast to previous work in which boules of silicon carbide have been produced and then either polished, cut, or sometimes grown, with a resulting flat top surface. In contrast, the invention represents the step of starting growth with a flat seed.

Without being held to any particular representations or admissions, the inventors believe that crystals as small as 10 mm in thickness have never been demonstrated with the shape (flat) characteristics disclosed and claimed herein. With respect to the 500 µm lower limit, this represents a reasonable general border that distinguishes the invention from growth processes in which the growth is carried out in concave fashion for 500 µm and thereafter flattened.

The method can further comprise using the temperature distribution in the growth crucible to produce the uniform flat to uniform slightly convex growth face. As is generally well understood in this art, the temperature profile in a crucible can be controlled using several different techniques to obtain desired gradients, isotherms, or other temperature effects. To some extent, these profiles can also be affected by the position in which the source materials, including silicon and carbon gas species, are introduced into the crucible.

In certain embodiments, the seed holder is made of graphite and the graphite is densified by applying organic materials to improve the thermal uniformity of the material under growth conditions. Although the exact density measurements (and their changes) have not been determined, the organic materials that have been found to provide satisfactory results include mixtures of alcohols and resins, such as a mixture of furfuryl alcohol and phenolic ("Novalac") resin in a ratio of 2.5:1. To date, growth improvements based on densifying the seed holder and improving the thermal uniformity represent empirical observations. Although the inventors do not wish to be bound by any particular theory, possible explanations include the consideration that porous graphite more readily permits undesired sublimation from the rear of the seed, or the consideration that porous graphite exhibits uneven thermal properties.

Phenolic resins are generally well understood in the chemical arts and an appropriate composition can be selected by those of ordinary skill in this art without undue experimentation. As a brief summary, phenolic resins are the condensation products of phenol or substituted phenols with aldehydes. Phenolic resins are thermosetting and do not include elements such as sulphur or nitrogen that tend to generate casting or molding defects in a finished seed holder and that would generally be disadvantageous in the sublimation techniques described herein.

In another aspect, the seed holder is carbon, including but not limited to graphite, that is selectively matched in terms of its coefficient of thermal expansion to the silicon carbide seed material to help ensure that the gap between the seed in the seed holder does not exceed 10 µm. A number of grades of carbon and graphite are commercially available and an appropriate carbon or graphite for this purpose can be selected by those of ordinary skill in this art without undue experimentation.

Graphite is, of course, one form of carbon, but the invention is not limited to graphite per se.

In another aspect of the invention, the thermal consistency between the seed crystal and the seed holder is accomplished by separating the seed and the seed holder in an arrangement that encourages radiative heat transfer to dominate over conductive heat transfer over substantially the entire usable area of the crystal. This embodiment has the same theme, goal, and function as the earlier embodiments-avoiding thermal inconsistencies (typically conductive ones) between the seed and the seed holder.

In this aspect, however, the thermal consistency is achieved by designing and keeping a sufficient gap between the seed and the seed crystal so that conductive heat transfer is avoided, thus avoiding the potential for inconsistent conductive heat transfers to encourage defects in the seed or in the growing crystal. As used herein, the term "gap" refers to the distance between the seed and the seed holder, but is not necessarily limited to describing empty space.

Thus, the gap can be filled with any desired material—solid, liquid, or gas—or it can even be a vacuum, provided it serves the required purpose and does not otherwise interfere with crystal growth.

As noted in the Background, sublimation from the rear of a seed crystal ("thermal etching") has been observed and can initiate defects. Accordingly, in another aspect, a thin film can be applied to the back surface of the seed to prevent thermal etching of that surface, or to prevent sublimation growth on the rear surface of the seed that would create an undesired conductive heat transfer between the seed and the seed holder. The thin film creates a diffusion barrier that prevents the silicon carbide from subliming through the barrier. The thin film is selected from materials that will remain stable without subliming, melting, or evaporating at the growth temperatures, and that will not otherwise interfere with the seeded growth techniques. Appropriate materials include but are not necessarily limited to, graphite, certain refractory metals, and metal carbides such as titanium carbide.

As in the other embodiments, the silicon carbide seed crystal is preferably selected to have a polytype selected from the group consisting of the 3C, 4H, 6H, and 15R polytypes of silicon carbide.

Additionally, it will be understood that the methods described herein are complementary rather than exclusive of one another, and thus several of the steps can be used concurrently or sequentially to achieve the desired result. Furthermore, the method has similar advantages for other semiconductor materials such as gallium nitride, aluminum gallium nitride, and aluminum nitride.

In yet another embodiment, the invention comprises the improvement in seeded silicon carbide growth of positioning a seed crystal on a seed holder using a low porosity backing material that provides a vapor barrier to silicon carbide sublimation from the seed and that minimizes the difference in thermal conductivity between the seed and the backing material to minimize or eliminate temperature differences across the seed and likewise minimize or eliminate vapor transport from the rear of the seed that would otherwise initiate and propagate defects from the rear of the seed towards the growth surface. In particular, the backing material should be selected so that its coefficient of thermal expansion at sublimation growth temperatures is as close as possible to that of the SiC seed crystal.

As used herein, the "back" or "rear" of the seed crystal refers to the surface that faces the seed holder. Thus, the "front" of the seed crystal represents the surface upon which bulk growth takes place.

Again, the technique of the embodiment is consistent with the goal of preventing sublimation from the rear of the seed crystal during growth because such sublimation tends to generate defects into and through the seed crystal and thereafter into and through the growing bulk single crystal.

In another aspect of this embodiment, the seed can be positioned on the seed holder with a high temperature adhesive, one examples of which includes graphite glue.

In yet another aspect of this embodiment, the method can comprise bonding the seed crystal to the seed holder with an appropriate material.

In describing the invention, it will be understood that a number of techniques are disclosed. Each of these has individual benefit, and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. In a method of producing a high quality bulk single crystal of silicon carbide in a seeded growth system, and in the absence of a solid silicon carbide source, the improvement comprising lapping both sides of the seed crystal prior to growth.

2. A method according to claim 1 comprising lapping both sides of the seed crystal to surfaces that are flat within 10 µm.

3. A method according to claim 1 comprising lapping both sides of the seed crystal to surfaces that are flat within 5 µm.

4. A method according to claim 1 comprising lapping both sides of the seed crystal to surfaces that are flat within 2 µm.

5. A method according to claim 1 comprising:
lapping the seed crystal using an abrasive slurry in conjunction with a hard surface to quickly remove a fairly large amount of material; and
thereafter polishing the seed crystal to produce a finished surface of semiconductor material.

6. A method according to claim 1 comprising initiating growth with seed crystal of silicon carbide that has a polytype selected from the group consisting of the 3C, 4H, 6H, and 15R polytypes.

7. In a method of producing a high quality bulk single crystal of silicon carbide in a seeded growth system, and in the absence of a solid silicon carbide source, the improvement comprising growing the bulk single crystal on a seed crystal that is at least 1 millimeter thick.

8. A method according to claim 7 comprising positioning the seed crystal for growth on a seed holder that deviates from flat by no more than 10 microns.

9. A method according to claim 7 comprising growing the bulk single crystal on a seed crystal that is at least 1.4 millimeters thick.

10. A method according to claim 7 comprising growing the bulk crystal on a seed crystal of silicon carbide substrate that has a polytype selected from the group consisting of the 3C, 4H, 6H, and 15R polytypes.

11. In a seeded growth method for producing a high quality bulk single crystal of silicon carbide, and in the absence of a solid silicon carbide source, the improvement comprising positioning the seed on the seed holder with a high temperature adhesive.

12. A method according to claim 11 comprising positioning the seed on the seed holder with graphite glue.

13. A method according to claim 11 comprising initiating growth with a seed crystal of silicon carbide that has a polytype selected from the group consisting of the 3C, 4H, 6H, and 15R polytypes.

14. In a method of producing a high quality bulk single crystal of silicon carbide in a seeded system, and in the absence of a solid silicon carbide source, the improvement comprising applying organic materials to a carbon seed-holder to improve the thermal uniformity of the seed holder under growth conditions.

15. A method according to claim 14 comprising applying a phenolic resin to the seed holder.

16. A method according to claim 14 comprising increasing the density of the seed holder using a mixture of an alcohol and a phenolic resin.

17. A method according to claim 14 comprising increasing the density of the seed holder using a mixture of furfuryl alcohol and phenolic resin in a ratio of 2.5:1.

18. A method according to claim 14 comprising matching the coefficient of thermal expansion of the seed holder to the coefficient of thermal expansion of the silicon carbide seed.

19. A method according to claim 14 comprising initiating growth with a seed crystal of silicon carbide that has a polytype selected from the group consisting of the 3C, 4H, 6H, and 15R polytypes.

20. In a seeded growth method for producing a high quality bulk single crystal of silicon carbide, and in the absence of a solid silicon carbide source, the improvement comprising selectively matching the coefficient of thermal expansion of the seed holder to the coefficient of thermal expansion of the silicon carbide seed.

21. A method according to claim 20 comprising matching a carbon seed holder to the silicon carbide seed material.

22. A method according to claim 20 comprising initiating growth with a seed crystal of silicon carbide that has a polytype selected from the group consisting of the 3C, 4H, 6H, and 15R polytypes.

23. In a method of producing a high quality bulk single crystal of silicon carbide in a seeded growth system, and in the absence of a solid silicon carbide source, the improvement comprising:
growing the bulk single crystal from a seed crystal with a seed holder-facing surface that deviates from flat by no more than 10 microns.

24. A method according to claim 23 comprising growing the bulk single crystal from a seed crystal with a seed holder-facing surface that deviates from flat by no more than 5 microns.

25. A method according to claim 23 comprising growing the bulk single crystal from a seed crystal with a seed holder-facing surface that deviates from flat by no more than 2 microns.

26. A method according to claim 23 comprising growing the bulk single crystal from a seed crystal with a seed holder-facing surface that deviates from flat by no more than 1 micron.

27. A method according to claim 23 comprising initiating growth with a seed crystal of silicon carbide that has a polytype selected from the group consisting of the 3C, 4H, 6H, and 15R polytypes.

28. In a method of producing a high quality bulk single crystal of silicon carbide in a seeded growth system, and in the absence of a solid silicon carbide source, the improvement comprising:
positioning the seed crystal for growth on a seed holder that deviates from flat by no more than 10 microns.

29. A method according to claim 28 comprising positioning the seed crystal for growth on a seed holder that deviates from flat by no more than 5 microns.

30. A method according to claim 28 comprising positioning the seed crystal for growth on a seed holder that deviates from flat by no more than 2 microns.

31. A method according to claim 28 comprising positioning the seed crystal for growth on a seed holder that deviates from flat by no more than 1 micron.

32. A method according to claim 28 comprising initiating growth with a seed crystal of silicon carbide that has a polytype selected from the group consisting of the 3C, 4H, 6H, and 15R polytypes.

33. In a method of producing a high quality bulk single crystal of silicon carbide in a seeded growth system, and in the absence of a solid silicon carbide source, the improvement comprising:

conforming the seed holder-facing surface of the seed crystal and the shape of the seed-holder to one another by preventing any gap between the seed and the seed-holder from exceeding 10 µm.

34. A method according to claim 33 comprising preventing any gap between the seed and the seed-holder from exceeding 5 µm.

35. A method according to claim 33 comprising preventing any gap between the seed and the seed-holder from exceeding 2 µm.

36. A method according to claim 33 comprising initiating growth with a seed crystal of silicon carbide that has a polytype selected from the group consisting of the 3C, 4H, 6H, and 15R polytypes.

37. A method according to claim 33 comprising growing the bulk single crystal at substantially the same diameter as the seed crystal.

38. A method according to claim 33 wherein the step of conforming the seed and the seed holder comprises preparing a seed crystal with the seed holder-facing surface that is flat within 10 µm.

39. A method according to claim 33 wherein the step of conforming the seed and the seed holder comprises preparing a seed crystal with the seed holder-facing surface that is flat within 5 µm.

40. A method according to claim 33 wherein the step of conforming the seed and the seed holder comprises preparing a seed crystal with the seed holder-facing surface that is flat within 2 µm.

41. A method according to claim 33 wherein the step of conforming the seed and the seed holder comprises preparing a seed holder with a seed-facing surface that is flat within 10 µm.

42. A method according to claim 33 wherein the step of conforming the seed and the seed holder comprises preparing a seed holder with a seed-facing surface that is flat within 5 µm.

43. A method according to claim 33 wherein the step of conforming the seed and the seed holder comprises preparing a seed holder with a seed-facing surface that is flat within 2 µm.

44. A method according to claim 33 comprising lapping a seed crystal that is at least 2 inches in diameter.

45. A method according to claim 33 comprising lapping a seed crystal that is at least 100 mm in diameter.

46. In a method of producing a high quality bulk single crystal of silicon carbide in a seeded growth system, and in the absence of a solid silicon carbide source, the improvement comprising:

maintaining a flat to slightly convex growth surface during the crystal growth while avoiding localized regions that show a concave surface shape within the first 10 mm of growth over the usable area of the crystal.

47. A method according to claim 46 comprising maintaining a flat to slightly convex growth surface during the first 500 µm of the crystal growth over the usable area of the crystal.

48. A method according to claim 46 comprising maintaining a flat to slightly convex growth surface with the convexity not exceeding a radius of curvature of 40 centimeters.

49. A method according to claim 46 comprising initiating growth with a seed crystal of silicon carbide that has a polytype selected from the group consisting of the 3C, 4H, 6H, and 15R polytypes.

50. In a method of producing a high quality bulk single crystal of silicon carbide in a seeded growth system, and in the absence of a solid silicon carbide source, the improvement comprising:

separating the rear of the silicon carbide crystal from the seed holder by an amount sufficient for radiative heat transfer to dominate over conductive heat transfer between the seed and the seed holder.

51. A method according to claim 50 comprising maintaining a vacuum between the seed and seed-holder directly behind the seed.

52. A method according to claim 50 comprising maintaining a gas filled space between the seed and seed-holder directly behind the seed.

53. A method according to claim 50 comprising initiating growth with a seed crystal of silicon carbide that has a polytype selected from the group consisting of the 3C, 4H, 6H, and 15R polytypes.

54. In a method of producing a high quality bulk single crystal of silicon carbide in a seeded growth system, and in the absence of a solid silicon carbide source, the improvement comprising:

positioning the seed crystal in a crucible while exerting minimal torsional forces on the seed crystal to thereby prevent torsional forces from warping or bowing the seed crystal in a manner that that would otherwise encourage sublimation from the rear of the seed crystal or undesired thermal differences across the seed crystal.

55. A method according to claim 54 comprising mounting the seed crystal in an edge ring seed cap and positioning the edge ring seed cap on the seed holder to thereby minimize the mechanical forces applied to the seed crystal and thereby minimize or eliminate any distortion in the seed crystal resulting from its mounting on the seed holder.

56. A method according to claim 54 comprising initiating growth with a seed crystal of silicon carbide that has a polytype selected from the group consisting of the 3C, 4H, 6H, and 15R polytypes.

57. In a method of producing a high quality bulk single crystal of silicon carbide in a seeded growth system, and in the absence of a solid silicon carbide source, the improvement comprising:

annealing the seed holder prior to crystal growth to prevent the seed holder from significant distortion during crystal growth and thereby minimize or eliminate temperature differences across the seed that would otherwise tend to initiate and propagate defects in the growing crystal; and thereafter initiating seeded growth with seed crystal.

58. A method according to claim 57 comprising growing the bulk single crystal at substantially the same diameter as the seed crystal.

59. A method according to claim 57 comprising initiating growth with a silicon carbide seed crystal that is at least 2 inches in diameter.

60. A method according to claim 57 comprising initiating growth with a silicon carbide seed crystal that is at least 100 mm in diameter.

61. A method according to claim 57 comprising annealing a seed holder at a temperature of at least about 2500° C. for a period of at least about 30 minutes.

62. A method according to claim 57 comprising initiating growth with a seed crystal of silicon carbide that has a polytype selected from the group consisting of the 3C, 4H, 6H, and 15R polytypes.

63. In a method of producing a high quality bulk single crystal of silicon carbide in a seeded growth system, and in the absence of a solid silicon carbide source, the improvement comprising:

positioning a seed crystal on the seed holder with a low porosity backing material that provides a vapor barrier to silicon carbide sublimation from the seed and that minimizes the difference in thermal conductivity between the seed and the backing material to minimize or eliminate temperature differences across the seed and likewise minimize or eliminate vapor transport from the rear of the seed that would otherwise initiate and propagate defects in the growing crystal.

64. A method according to claim 63 comprising positioning the seed on the seed holder with a material that has a high carbon content, organic filler.

65. A method according to claim 63 comprising positioning the seed on the seed holder with a high temperature adhesive.

66. A seeded growth system according to claim 63 wherein said backing material has a coefficient of thermal expansion as close as possible to that of the SiC seed crystal.

67. A method according to claim 63 comprising positioning a seed crystal of silicon carbide that has a polytype selected from the group consisting of the 3C, 4H, 6H, and 15R polytypes.

68. In a method of producing a high quality bulk single crystal of silicon carbide in a seeded growth system, and in the absence of a solid silicon carbide source, the improvement comprising:

initiating growth with a seed crystal of silicon carbide that has a polytype selected from the group consisting of the 3C, 4H, 6H, and 15R polytypes; and reducing the separation between the silicon carbide seed crystal and a seed holder until conductive heat transfer between the seed crystal and the seed holder dominates radiative heat transfer between the seed crystal and the seed holder over substantially the entire seed crystal surface that is adjacent the seed holder.

\* \* \* \* \*

UNITED STATES PATENT AND TRADEMARK OFFICE
CERTIFICATE OF CORRECTION

PATENT NO. : 7,316,747 B2 Page 1 of 1
APPLICATION NO. : 11/248579
DATED : January 8, 2008
INVENTOR(S) : Jason Ronald Jenny et al.

It is certified that error appears in the above-identified patent and that said Letters Patent is hereby corrected as shown below:

On the Title Page under OTHER PUBLICATIONS cited:
Item 56
Delete: "POWELL; "Growth of Low Micropipe Density SiC Wafers" Materials Science Forum, Vol. 336-340, 2000, pp. 437-440"

Insert -- POWELL; "Growth of Low Micropipe Density SiC Wafers" Materials Science Forum, Vol. 338-340, 2000, pp. 437-440 --

On the Title Page Item 56
Delete: "DMITRIEV et al.; "Large Area Silicon Carbide Devices Fabricated on SiC Wafers with Reduced Micropipe Density", Materials Science and Engineering, Vol. 861-62, 1999, pp. 446-449"

Insert -- DMITRIEV et al.; "Large Area Silicon Carbide Devices Fabricated on SiC Wafers with Reduced Micropipe Density", Materials Science and Engineering, Vol. B61-62, 1999, pp. 446-449 --

On the Title Page Item 56
Delete: "LILOV et al.; "Studies of Growth Processes in Silicon Carbide Epitaxial Layers from the Vapour Phase", Journal of Crystal Growth, Vol. 32, 1976, pp. 170-176"

Insert -- LILOV et al.; "Studies of Growth Processes in Silicon Carbide Epitaxial Layers from the Vapour Phase", Journal of Crystal Growth, Vol. 32, 1976, pp. 170-178 --

Signed and Sealed this

Twentieth Day of May, 2008

JON W. DUDAS
*Director of the United States Patent and Trademark Office*